(12) United States Patent
Kang et al.

(10) Patent No.: US 7,710,759 B2
(45) Date of Patent: *May 4, 2010

(54) NONVOLATILE FERROELECTRIC MEMORY DEVICE

(75) Inventors: Hee Bok Kang, Cheongju-si (KR); Jin Hong Ahn, Anyang-si (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 432 days.

This patent is subject to a terminal disclaimer.

(21) Appl. No.: 11/526,776

(22) Filed: Sep. 26, 2006

(65) Prior Publication Data
US 2007/0086231 A1    Apr. 19, 2007

(30) Foreign Application Priority Data
Oct. 13, 2005    (KR) ................. 10-2005-0096567

(51) Int. Cl.
*G11C 11/22* (2006.01)

(52) U.S. Cl. ............... 365/145; 365/230.06; 365/202

(58) Field of Classification Search ............. 365/145, 365/230.06, 202, 190, 191, 104, 182, 185.27, 365/189.03, 185.23
See application file for complete search history.

(56) References Cited

U.S. PATENT DOCUMENTS

| | | | |
|---|---|---|---|
| 6,532,165 B1* | 3/2003 | Katori | 365/145 |
| 7,297,997 B2* | 11/2007 | Shin et al. | 257/296 |
| 7,372,744 B2* | 5/2008 | Shiga et al. | 365/189.05 |
| 2006/0050314 A1* | 3/2006 | Shiga et al. | 358/1.16 |
| 2007/0029618 A1* | 2/2007 | Walker | 257/368 |
| 2007/0086230 A1* | 4/2007 | Kang et al. | 365/145 |

* cited by examiner

*Primary Examiner*—Dang T Nguyen
(74) *Attorney, Agent, or Firm*—IP & T Law Firm PLC

(57) ABSTRACT

A nonvolatile ferroelectric memory device includes a plurality of memory cells connected serially between a bit line and a sensing line, a first switching unit configured to selectively connect the memory cells to the bit line in response to a first selecting signal, and a second switching unit configured to selectively connect the memory cells to the sensing line in response to a second selecting signal. The first switching unit and the second switching unit have the same structure as that of the memory cell.

17 Claims, 15 Drawing Sheets

NONVOLATILE FERROELECTRIC MEMORY DEVICE

RELATED APPLICATION

This application is based upon and claims the priority of benefit to Korean Patent Application No. 10-2005-0096567, filed on Oct. 13, 2005, the entire contents of which are incorporated by reference herein.

BACKGROUND

1. Technical Field

The present invention generally relates to a nonvolatile ferroelectric memory device, and more specifically, to a technology of controlling a read operation of a nonvolatile memory cell using a channel resistance of the memory cell which changes with a polarization state of a nano-scaled ferroelectric material.

2. Description of the Related Art

Generally, a ferroelectric random access memory (hereinafter referred to as 'FeRAM') has attracted considerable attention as next generation memory device because it has a data processing speed as fast as a Dynamic Random Access Memory (hereinafter, referred to as 'DRAM') and preserves data even after the power is turned off.

A FeRAM having a structure similar to a DRAM includes capacitors made of a ferroelectric substance, so that it utilizes the high residual polarization characteristic of the ferroelectric substance in which data is not deleted even after an electric field is eliminated.

A unit cell of a conventional nonvolatile FeRAM device includes a switching element and a nonvolatile ferroelectric capacitor. The switching element performs a switching operation depending on a state of a word line to connect a nonvolatile ferroelectric capacitor to a bit line or disconnect the nonvolatile ferroelectric capacitor from the bit line. The nonvolatile ferroelectric capacitor is connected between a plate line and a terminal of the switching element. Here, the switching element of the conventional FeRAM is an NMOS transistor whose switching operation is controlled by a gate control signal.

FIG. 1 is a cross-sectional view of a unit cell of a conventional nonvolatile ferroelectric memory device.

A conventional 1-T (One-Transistor) FET (Field Effect Transistor) cell includes an n-type drain 2 and an n-type source 3 which are formed in a p-type substrate 1. Also, the cell includes an insulation oxide 4, a ferroelectric layer 5, and a word line 6 which are sequentially formed on a channel region between the drain 2 and the source 3.

The above-described conventional nonvolatile FeRAM device reads and writes data by using a channel resistance of the memory cell which changes with a polarization state of the ferroelectric layer 5.

Specifically, the channel region has a high resistance when the polarity of the ferroelectric layer 5 induces positive charges to the channel, and a low resistance when the polarity of the ferroelectric layer 5 induces negative charges to the channel.

However, in the conventional nonvolatile FeRAM device, when the cell is scaled down, a data retention characteristic is degraded, especially if a nonvolatile ferroelectric memory cell has been fabricated on a nanometer scale. For example, in a read mode, a read voltage may appear at adjacent cells, which can generate crosstalk noise, thereby destroying data stored in these cells. In a write mode, a write voltage may appear at an unselected cell so that data stored in unselected cells are destroyed. As a result, it is difficult to perform a random access operation.

SUMMARY

Various embodiments of the present invention are directed at providing a nonvolatile ferroelectric memory device including a floating channel layer between a top word line and a bottom word line to improve reliability of cells.

Various embodiments of the present invention are directed at providing a nonvolatile ferroelectric memory device including a nano-scaled floating channel layer between a top word line and a bottom word line to reduce the whole size of the cell.

Various embodiments of the present invention are directed at providing a nonvolatile ferroelectric memory device including a switching element for controlling a switching operation of a memory cell that has the same structure as that of a cell transistor to simplify the process.

Various embodiments of the present invention are directed at providing a nonvolatile ferroelectric memory device including a switching element for controlling a switching operation of a memory cell that has the same structure as that of a cell transistor to easily regulate a voltage applied to a memory cell.

Consistent with the present invention, there is provided a nonvolatile ferroelectric memory device that includes a plurality of memory cells connected serially between a bit line and a sensing line; a first switching unit configured to selectively connect the memory cells to the bit line in response to a first selecting signal; and a second switching unit configured to selectively connect the memory cells to the sensing line in response to a second selecting signal. Each of the plurality of memory cells, the first switching unit, and the second switching unit includes a bottom word line; an insulating layer formed on the bottom word line; a floating channel layer formed on the insulating layer; a ferroelectric layer formed on the floating channel layer; and a top word line formed on the ferroelectric layer in parallel with the bottom word line.

Consistent with the present invention, there is also provided a nonvolatile ferroelectric memory device that includes a plurality of bit lines; a plurality of sensing lines; a plurality of unit cell arrays connected in common to the bit lines in a column direction and to the sensing lines in a row direction; and a plurality of sense amplifiers connected to the plurality of bit line. Each of the plurality of unit cell arrays includes a plurality of memory cells connected serially between the corresponding bit line and the corresponding sensing line; a first switching unit configured to selectively connect the memory cells to the corresponding bit line in response to a first selecting signal; and a second switching unit configured to selectively connect the memory cells to the corresponding sensing line in response to a second selecting signal. Each of the plurality of memory cells, the first switching unit, and the second switching unit includes a bottom word line; an insulating layer formed on the bottom word line; a floating channel layer formed on the insulating layer; a ferroelectric layer formed on the floating channel layer; and a top word line formed on the ferroelectric layer in parallel with the bottom word line.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like part.

Figure 1:
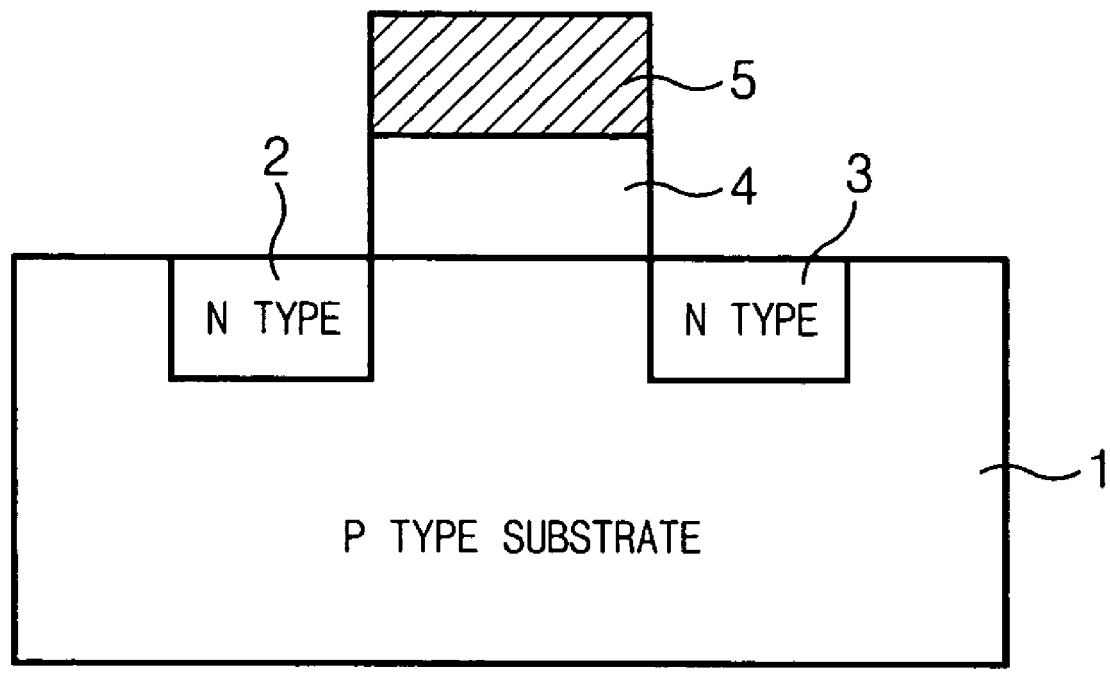
FIG. 1 is a cross-sectional diagram illustrating a unit cell of a conventional nonvolatile ferroelectric memory device.
Figure 2A:
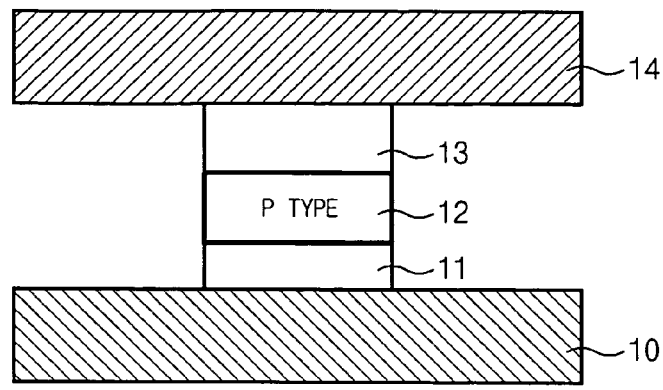
FIGS. 2a and 2b are cross-sectional diagrams illustrating a unit cell of a nonvolatile ferroelectric memory device according to an embodiment of the present invention.
Figure 2B:
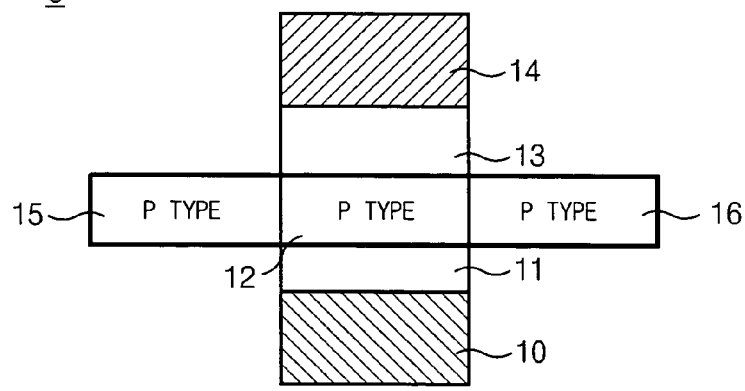

FIGS. 2a and 2b are cross-sectional views of a unit cell 9 of a nonvolatile ferroelectric memory device consistent with the present invention.

FIG. 2a is a cross-sectional view cut in parallel with a top word line 14.

Referring to FIG. 2a, the unit cell 9 includes a bottom word line 10, an oxide film 11, a bit line including a p-type floating channel region 12, a ferroelectric layer 13, and the top word line 14. The bottom word line 10 is arranged in parallel with the top word line 14. Both the bottom word line 10 and the top word line 14 are selectively driven by a row address decoder (not shown).

FIG. 2b is a cross-sectional view cut perpendicular to the top word line 14.

Referring to FIG. 2b, the bit line further includes a p-type drain region 15 and a p-type source region 16. The bit line is formed of at least one of a carbon nano tube, a silicon, a germanium, and an organic semiconductor.

The unit cell 9 reads and writes data by a channel resistance which changes with a polarization state of the ferroelectric layer 13.

Figure 2C:
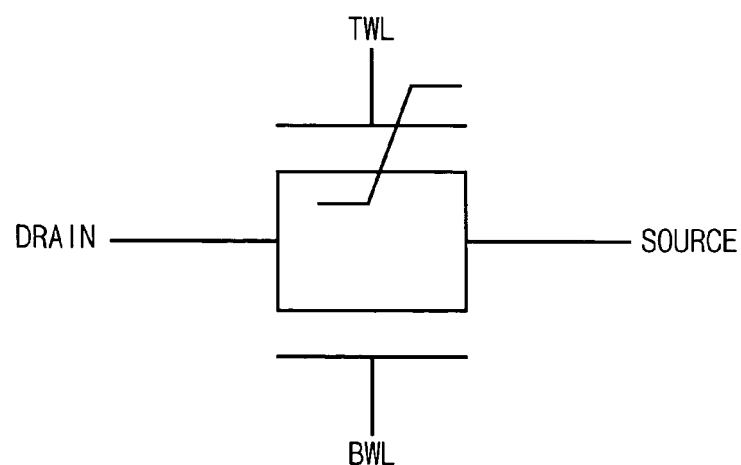
FIG. 2c is a circuit diagram illustrating a unit cell of a nonvolatile ferroelectric memory device according to an embodiment of the present invention.

FIG. 2c is a circuit diagram representing the unit cell 9 of a nonvolatile ferroelectric memory device consistent with the present invention. Labels "TWL" and "BWL" designate the top word line 14 and the bottom word line 10, respectively.

FIGS. 3a-3c and 4a-4c are diagrams illustrating read and write operations of the unit cell 9.

Figure 3A:
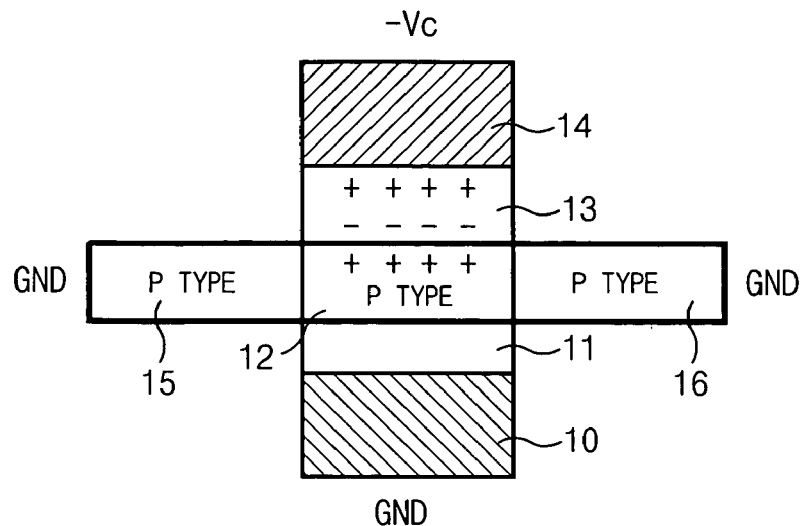
FIGS. 3a through 3c are diagrams illustrating read and write operations of high level data "1" in a unit cell of a nonvolatile ferroelectric memory device according to an embodiment of the present invention.

FIG. 3a is a diagram illustrating the operation of writing a bit of "1" in the unit cell 9. Referring to FIG. 3a, a ground voltage GND (or a positive voltage +V) is applied to the bottom word line 10, and a negative voltage −Vc is applied to the top word line 14. The drain region 15 and the source region 16 are grounded. As a result of the voltages applied to the bottom word line 10, the top word line 14, the drain region 15, and the source region 16, a voltage drop is created across the ferroelectric layer 13 between the top word line 14 and the p-type channel region 12, resulting in a polarity of the ferroelectric layer 13 that induces positive charges to the top portion of the p-type channel region 12. Consequently, a bit of "1" is written in the unit cell 9.

Figure 3B:
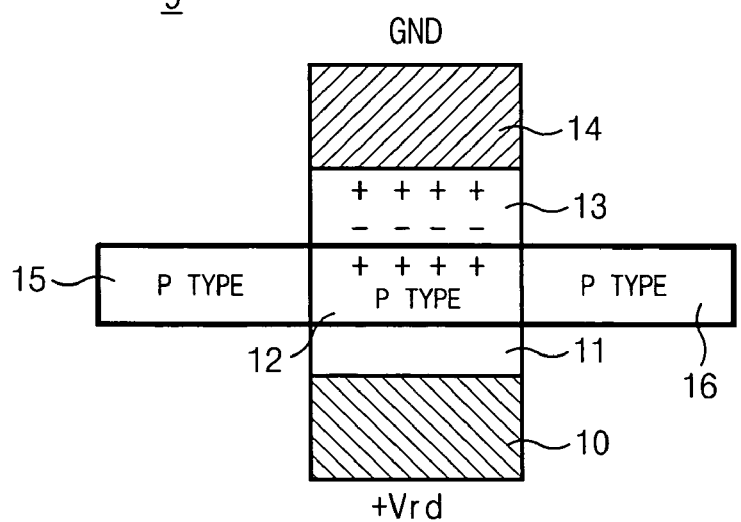
Figure 3C:
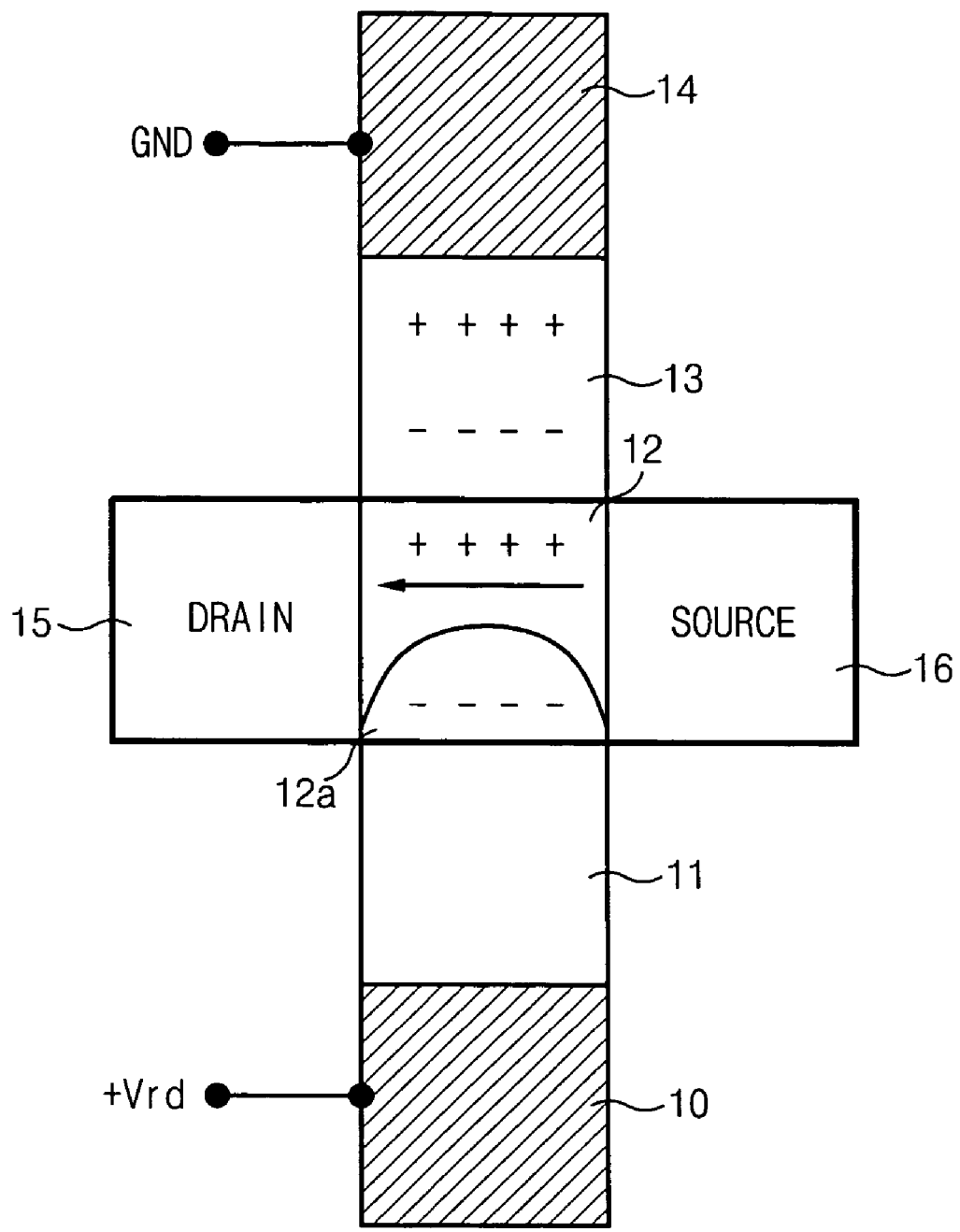

FIGS. 3b and 3c are diagrams illustrating the read operation of the unit cell 9 when a bit of "1" is stored in the unit cell 9, wherein FIG. 3c is an exaggerated view of FIG. 3b.

Referring to FIGS. 3b and 3c, when a positive read voltage +Vrd is applied to the bottom word line 10, a depletion layer 12a is formed in the bottom portion of the p-type channel region 12. However, since the top word line 14 is at the ground voltage GND and the polarity of the ferroelectric layer 14 induces positive charges to the p-type channel region 12, a channel exists in the p-type channel region 12. As a result, a voltage difference between the drain region 15 and the source region 16 will induce a significant amount of current through the p-type channel region, from which it may be determined that a bit of "1" is stored in the unit cell 9.

Figure 4A:
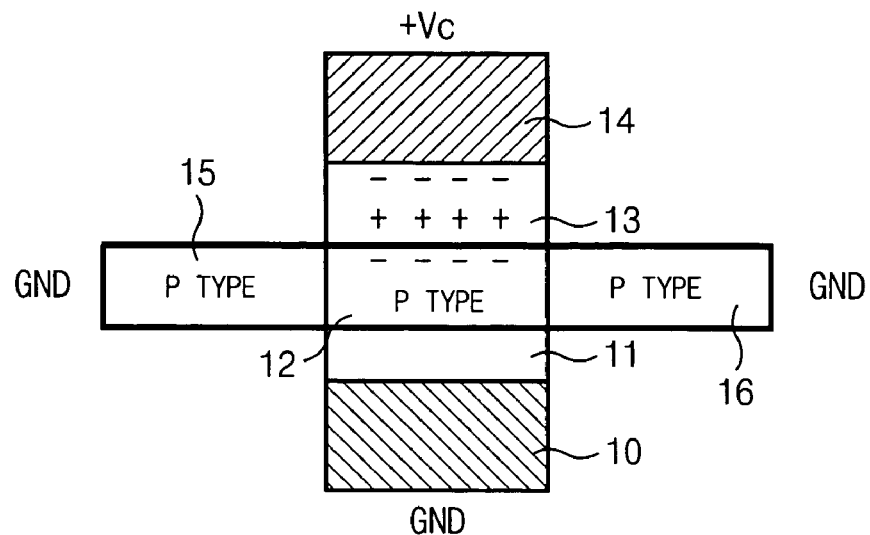
FIGS. 4a through 4c are diagrams illustrating read and write operations of low level data "0" in a unit cell of a nonvolatile ferroelectric memory device according to an embodiment of the present invention.

FIG. 4a is a diagram illustrating the operation of writing a bit of "0" in the unit cell 9.

Referring to FIG. 4a, the ground voltage GND (or a negative voltage −V) is applied to the bottom word line 10, and a positive polarization transition threshold voltage +Vc, corresponding to a threshold voltage that is, when applied across the ferroelectric layer 13, sufficient to set a polarity of the ferroelectric layer 13 that induces negative charges into the portion of the channel region 12 next to the ferroelectric layer 13, is applied to the top word line 14. The drain region 15 and the source region 16 are grounded.

As a result of the voltages applied to he bottom word line 10, the top word line 14, the drain region 15, and the source region 16, a voltage drop is created between the top word line 14 and the p-type channel region 12, resulting in a polarity of the ferroelectric layer 13 that induces negative charges to the top portion of the p-type channel region 12. Consequently, a bit of "0" is stored in the unit cell 9.

Figure 4B:
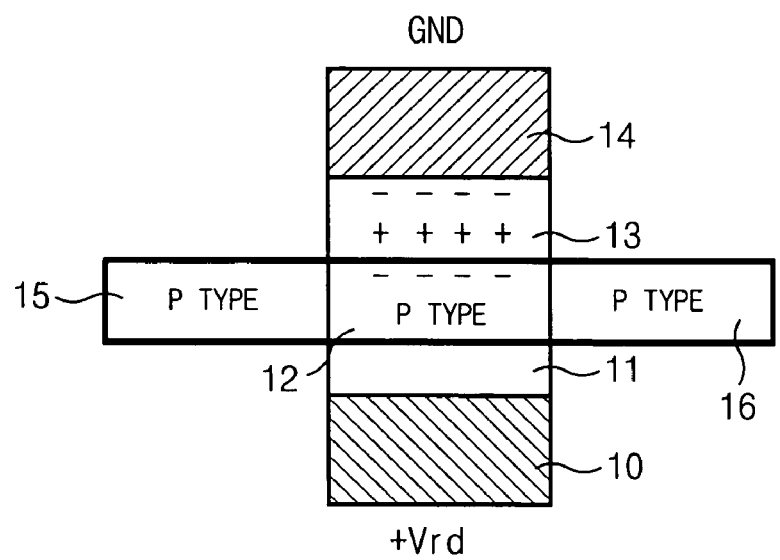
Figure 4C:
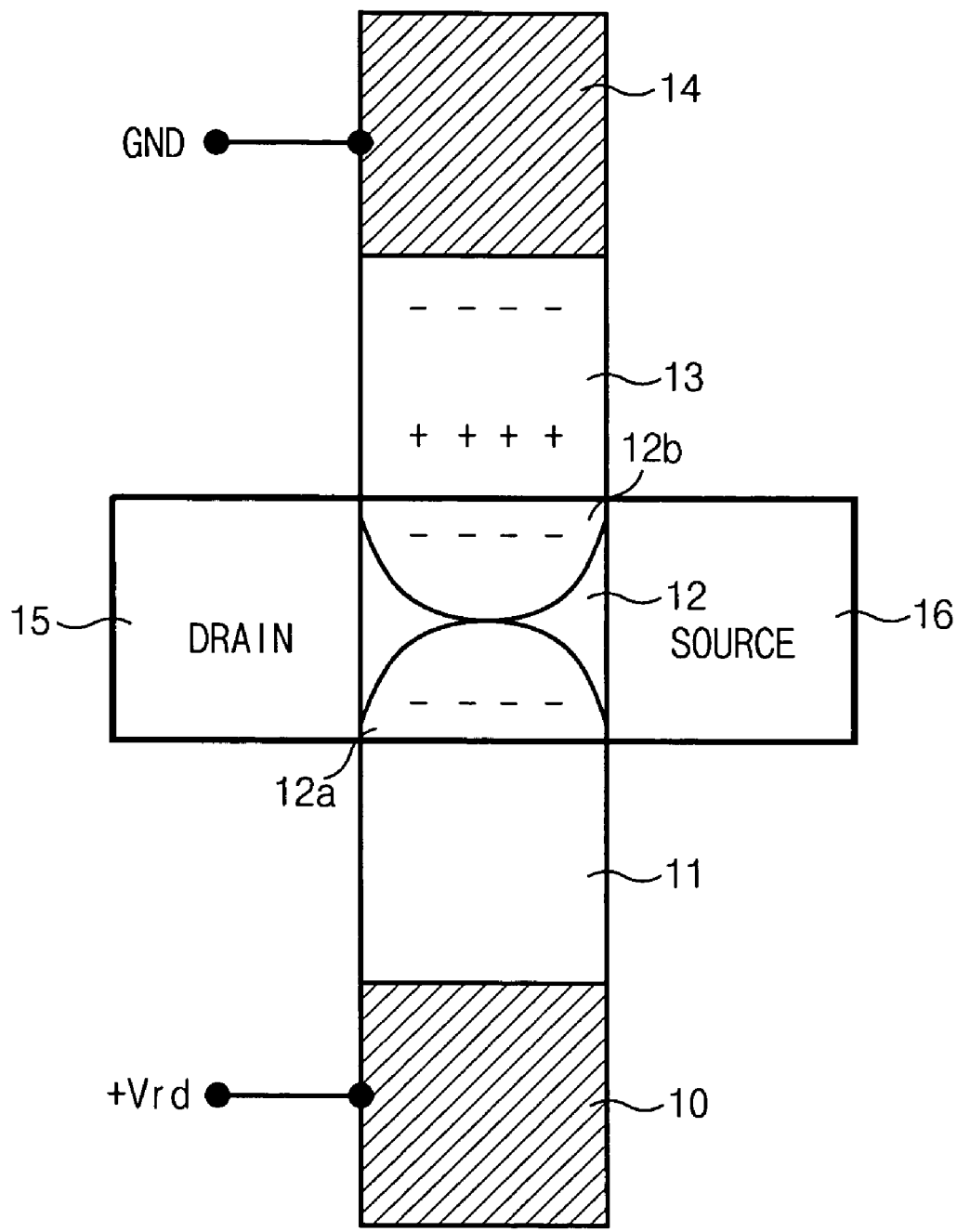

FIGS. 4b and 4c are diagrams illustrating the read operation of the unit cell 9 when the unit cell 9 has a bit of "0" stored therein.

Referring to FIGS. 4b and 4c, when the positive read voltage +Vrd is applied to the bottom word line 10, a depletion layer 12a is formed in the bottom portion of the p-type channel region 12. In the mean time, the top word line 14 is grounded. Therefore, a depletion layer 12b is formed in the top portion of the p-type channel region 12 because of the polarity of the ferroelectric layer 13, which induces negative charges to the p-type channel region 12. The depletion regions 12a and 12b effectively block a current path between the drain region 15 and the source region 16. As a result, a voltage difference between the drain region 15 and the source region 16 does not generate a significant current through the p-type channel region 12, from which it may be determined that a bit of "0" is stored in the unit cell 9.

In the unit cell 9 consistent with the present invention, the top word line 14 is at the ground voltage GND in a read mode. As a result, a voltage stress is avoided and the data retention characteristic of the unit cell 9 is improved.

Figure 5:
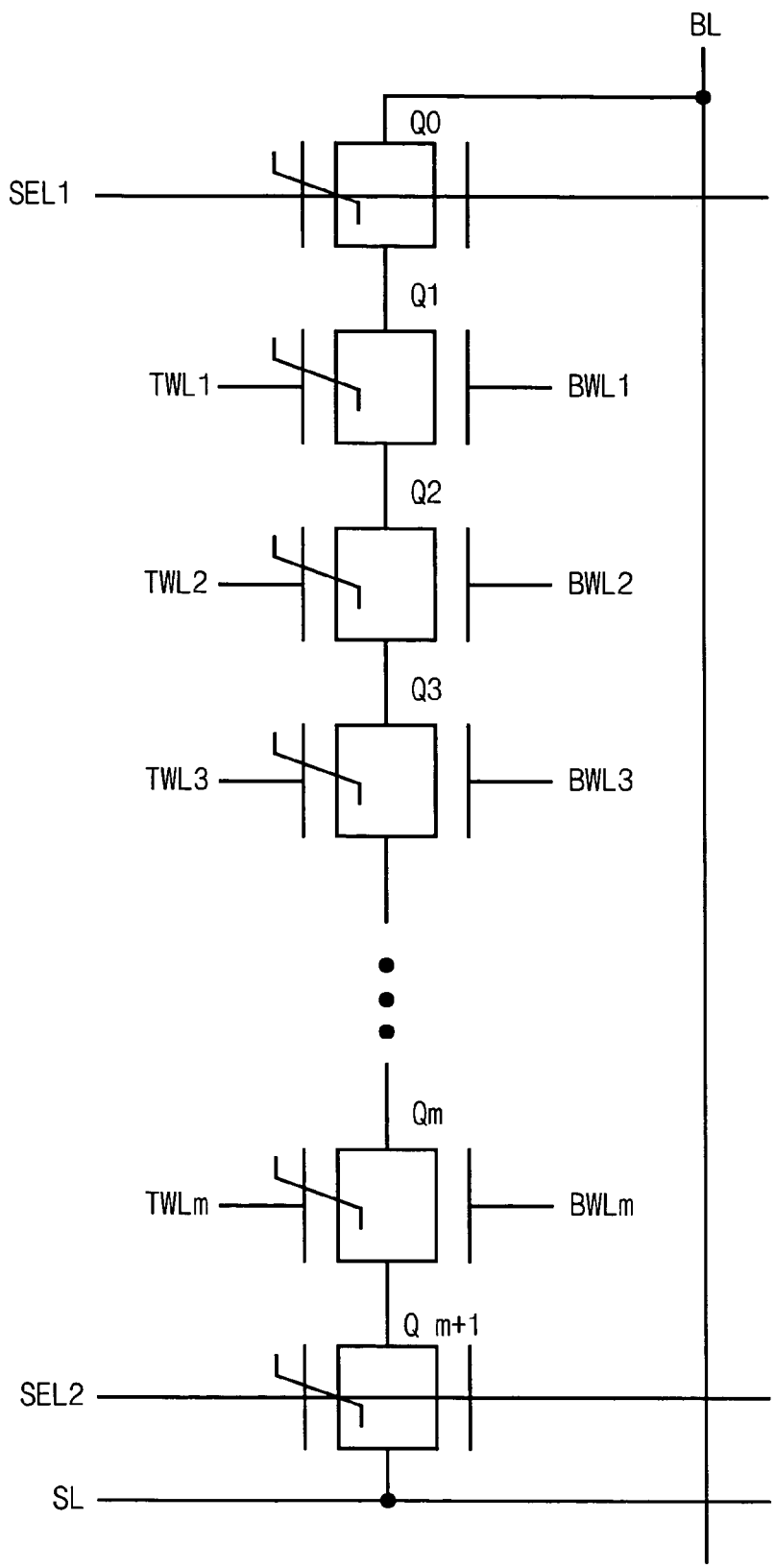
FIG. 5 is a plane diagram illustrating a unit cell array of a nonvolatile ferroelectric memory device according to an embodiment of the present invention.

FIG. 5 is a diagram illustrating a memory cell array of a nonvolatile ferroelectric memory device consistent with the present invention. As shown in FIG. 5, the cell array includes switching elements $Q_0$, $Q_{m+1}$ and a plurality of memory cells $Q_1 \sim Q_m$.

The switching element $Q_0$ is connected between a bit line BL and a memory cell $Q_1$ to connect the memory cell $Q_1$ to the bit line BL in response to a voltage applied to a selecting line SEL1. The switching element $Q_0$ may have the same structure as the memory cells $Q_1 \sim Q_m$. The switching element $Q_{m+1}$ is connected between a sensing line SL and the memory cell $Q_m$ to connect the memory cell $Q_m$ to the sensing line SL in response to a voltage applied to a selecting line SEL2. The switching element $Q_{m+1}$ may also have the same structure as the memory cells $Q_1 \sim Q_m$.

The plurality of memory cells $Q_1 \sim Q_m$ are connected serially between the switching elements $Q_0$ and $Q_{m+1}$, and are selected by voltages applied to the corresponding top word lines TWL1~TWLm and bottom word lines BWL1~BWLm.

Figure 6:
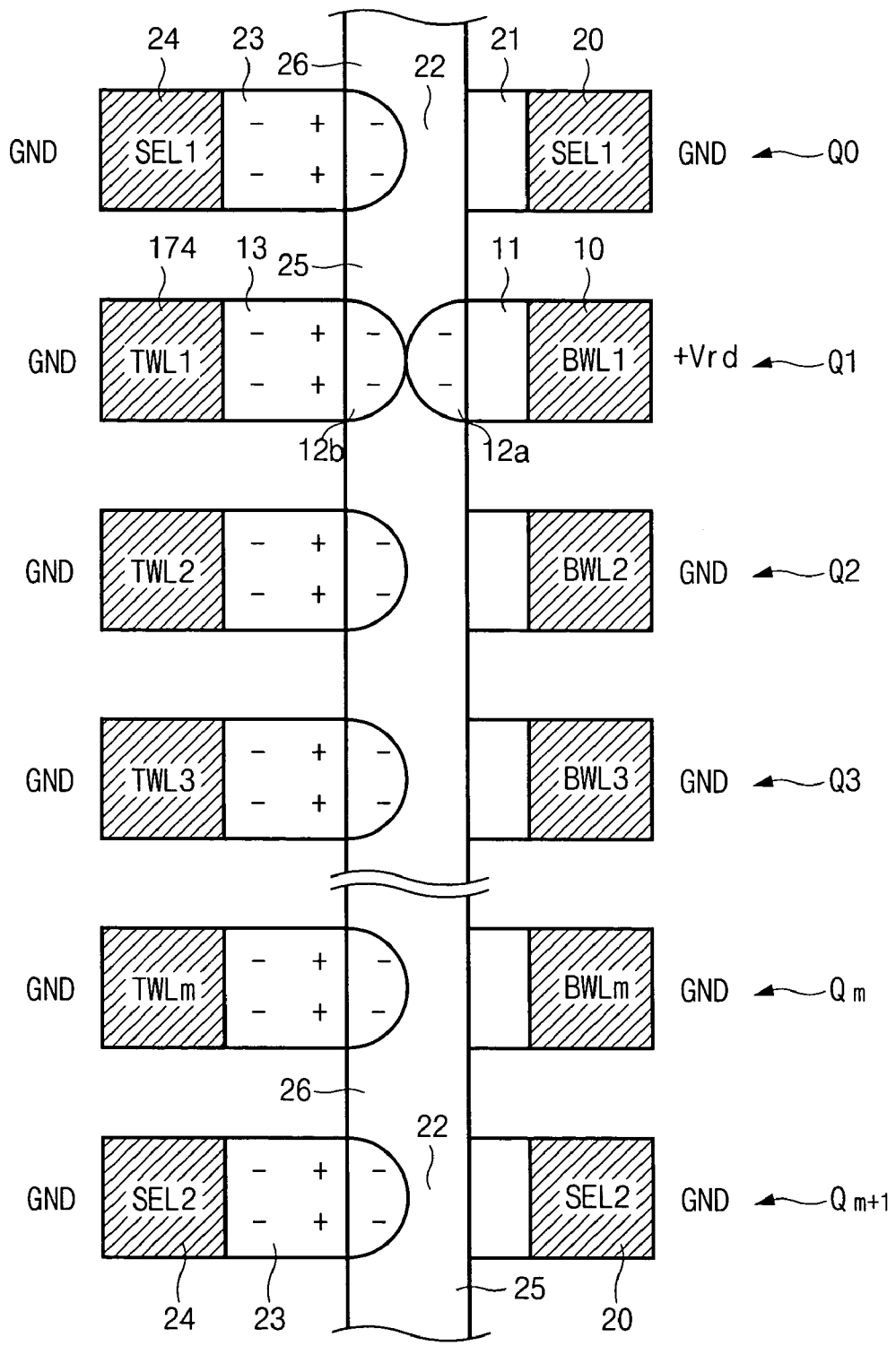
FIG. 6 is a cross-sectional diagram illustrating the read operation of the low data "0" of the unit cell array of FIG. 5.

FIG. 6 is a cross-sectional diagram illustrating the read operation of the cell array of FIG. 5. Each of the memory cells $Q_1 \sim Q_m$ has the same structure as the unit cell 9 shown in FIG. 2. It is assumed that the memory cell $Q_1$ is selected and that a bit of "0" is stored in the memory cell $Q_1$.

FIG. 6 shows that each of the switching elements $Q_0$ and $Q_{m+1}$ includes a bottom electrode 20, an oxide film 21, a floating channel layer, a ferroelectric layer 23 and a top electrode 24. Here, the floating channel layer includes a p-type channel region 22, a p-type drain region 25 and a p-type source region 26. Both the bottom electrode 20 and the top electrode 24 of the switching element $Q_0$ are connected to the selecting line SEL1. Both the bottom electrode 20 and the top electrode 24 of the switching element $Q_{m+1}$ are connected to the selecting line SEL2.

A ground voltage is applied to the top electrode 24 and the bottom electrode 20 of the switching element $Q_0$ through the selecting line SEL1. As a result, a current path exists between the bit line BL and the memory cell $Q_1$.

The top word lines TWL1~TWLm are grounded. A positive read voltage +Vrd is applied to the bottom word line BWL1 of the selected cell $Q_1$, and the bottom word lines BWL2~BWLm are grounded.

Because the top word lines TWL2~TWLm and the bottom word lines BWL2~BWLm are grounded, a current path exists through the memory cells $Q_2 \sim Q_m$, and the amount of current through the bit line depends on a current path through the memory cell $Q_1$. Because of the read voltage +Vrd applied to the bottom word line BWL1 of the memory cell $Q_1$, a depletion region such as depletion region 12a shown in FIGS. 3c and 4c is formed in a portion of the channel region 12 next to the bottom word line BWL1. Also, because a bit of "0" is stored in the memory cell $Q_1$, a depletion region such as the depletion region 12b as shown in FIG. 4c is formed in a portion of the channel region 12 next to the top word line TWL1. The depletion regions 12a and 12b effectively block a current path between the drain region 15 and the source region 16 of the memory cell $Q_1$. As a result, a voltage difference between the drain region 15 and the source region 16 of the memory cell $Q_1$ does not generate a significant current through the p-type channel region 12, from which it may be determined that a bit of "0" is stored in the memory cell $Q_1$.

Figure 7:
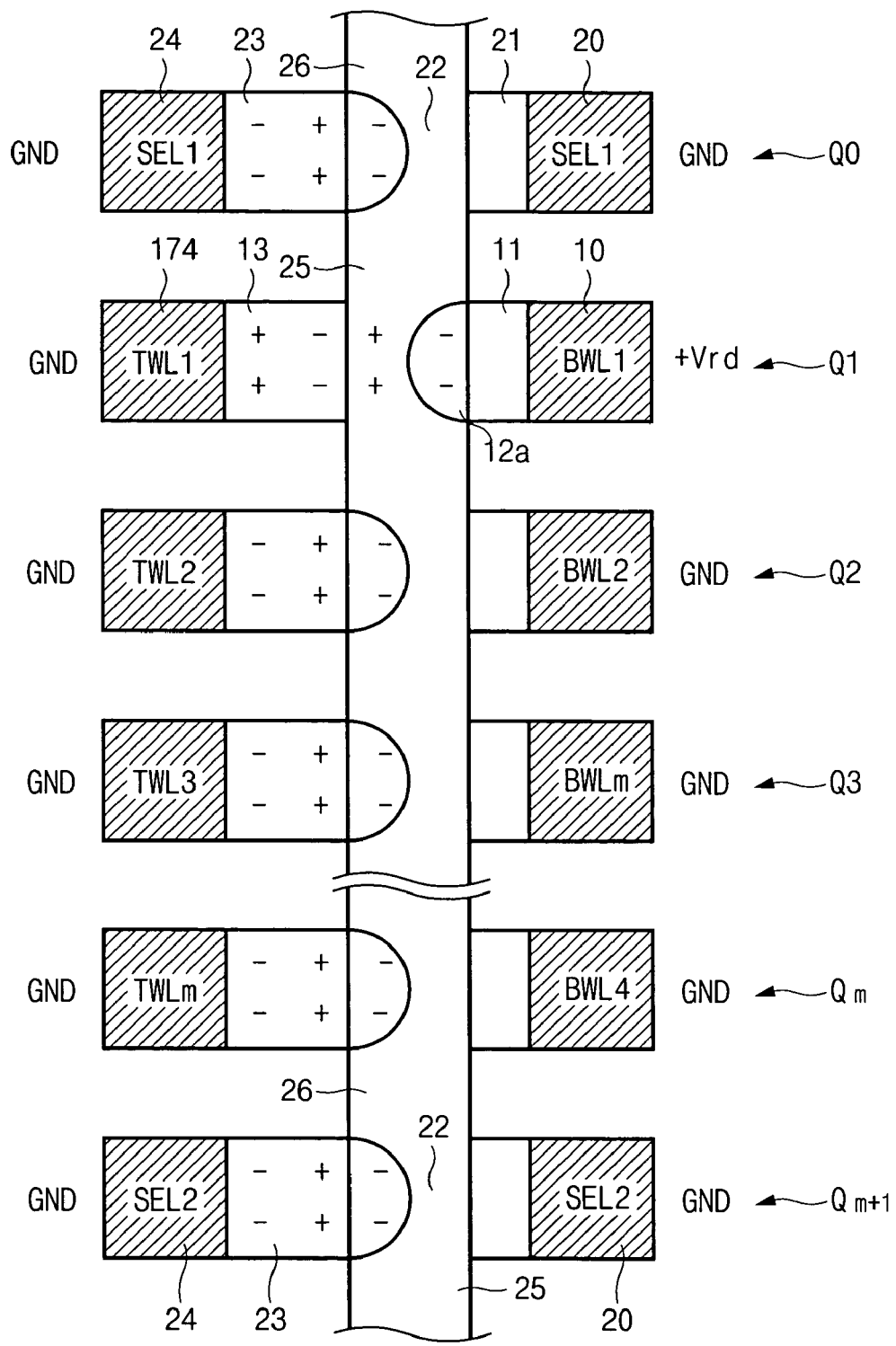
FIG. 7 is a cross-sectional diagram illustrating the read operation of the high data "1" of the unit cell array of FIG. 5.

FIG. 7 is a cross-sectional diagram illustrating the read operation of the cell array of FIG. 5. It is assumed that the memory cell $Q_1$ is selected and that a bit of "0" is stored in the memory cell $Q_1$.

Similarly, a ground voltage is applied to the top electrode 24 and the bottom electrode 20 of the switching element $Q_0$ through the selecting line SEL1. The top word lines TWL1~TWLm are grounded. A positive read voltage +Vrd is applied to the bottom word line BWL1 of the selected cell $Q_1$, and the bottom word lines BWL2~BWLm are grounded. As a result, a current path exists through the switching elements $Q_0$ and $Q_{m+1}$, and the memory cells $Q_2 \sim Q_m$. Thus, the amount of current through the bit line BL is determined by a current path through the memory cell $Q_1$.

Because of the read voltage +Vrd applied to the bottom word line BWL1 of the memory cell $Q_1$, a depletion region such as depletion region 12a shown in FIGS. 3c and 4c is formed in a portion of the channel region 12 next to the bottom word line BWL1. However, because a bit of "1" is stored in the memory cell $Q_1$, positive charges are induced to the portion of the channel region 12 next to the top word line TWL1. As a result, a current path exists through the memory cell $Q_1$. As a result, a voltage difference between the drain region 15 and the source region 16 of the memory cell $Q_1$ generates a significant current through the p-type channel region 12, from which it may be determined that a bit of "1" is stored in the memory cell $Q_1$.

It is to be understood that, although FIGS. 6 and 7 indicate that the memory cells $Q_2 \sim Q_m$ each have a bit of "0" stored therein, the memory cells $Q_2 \sim Q_m$ do not have to have bits of "0" stored therein. As long as the portion of the floating layer 12 of each of the memory cells $Q_2 \sim Q_m$ next to the corresponding bottom word line is not depleted, a current path exists through the corresponding memory cell so that the selected memory cell can be properly read.

Figure 8:
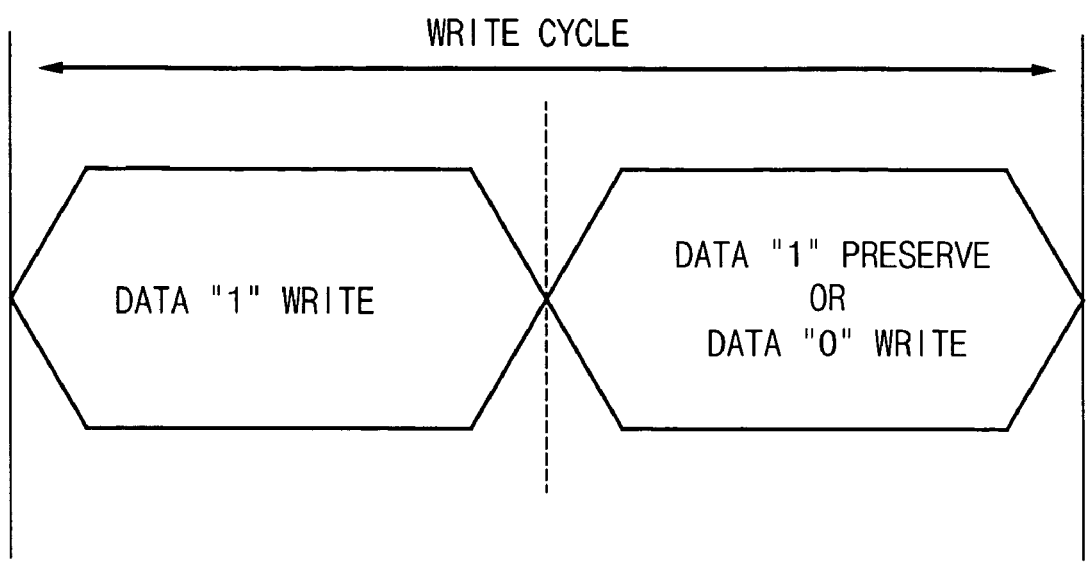
FIG. 8 is a timing diagram illustrating a write cycle of a nonvolatile ferroelectric memory device according to an embodiment of the present invention.

FIG. 8 is a timing diagram illustrating a write cycle of a nonvolatile ferroelectric memory device consistent with the present invention.

Referring to FIG. 8, a write cycle includes two steps. In a first step, bits of "1" are written into some of the memory cells of the memory device. In a second step, bits of "0" are written into the remaining memory cells of the memory device.

After the bits of "1" are written during the first step, the bits of "1" are maintained during the second period, by a voltage having a potential half that of the polarization transition threshold voltage Vc applied to the corresponding bit line BL.

Figure 9:
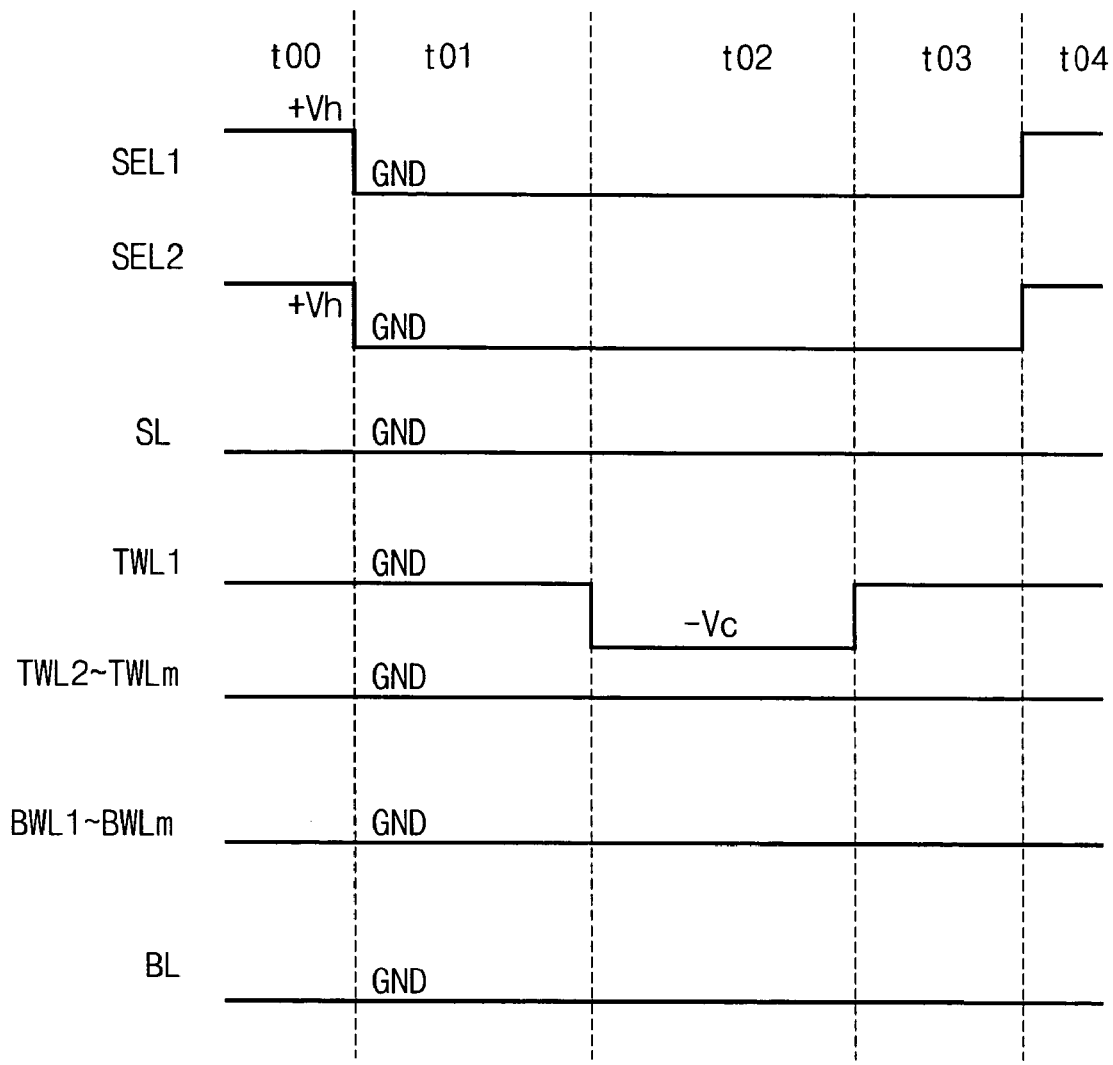
FIG. 9 is a timing diagram illustrating a write operation in a first operation period.

FIG. 9 is a timing diagram of the first step, during which bits of "1" are written into the memory device. It is assumed in FIG. 9 that the memory device includes such a memory array as shown in FIG. 5 and that the first memory cell $Q_1$ of the cell array of FIG. 5 is selected.

FIG. 9 shows that the first step includes five time periods, t00~t04. The first period t00 and the fifth period t04 are precharge periods, during which a high level voltage +Vh is applied to selecting lines SEL1 and SEL2, and other lines are at the ground state GND.

In the second period t01, the selecting lines SEL1 and SEL2 are grounded.

In a third period t02, a negative polarization transition threshold voltage −Vc is applied to the top word line TWL1 of the selected memory cell $Q_1$. The negative polarization transition threshold voltage −Vc is a voltage that, when applied across the ferroelectric layer 13, is sufficient to set the polarity of the ferroelectric layer 13 to induce positive charges into the portion of the channel region 12 next to the ferroelectric layer 13. As a result, a bit of "1" is written into the selected memory cell $Q_1$.

In the fourth period t03, the top word line TWL1 of the selected memory cell $Q_1$ is grounded.

Figure 10:
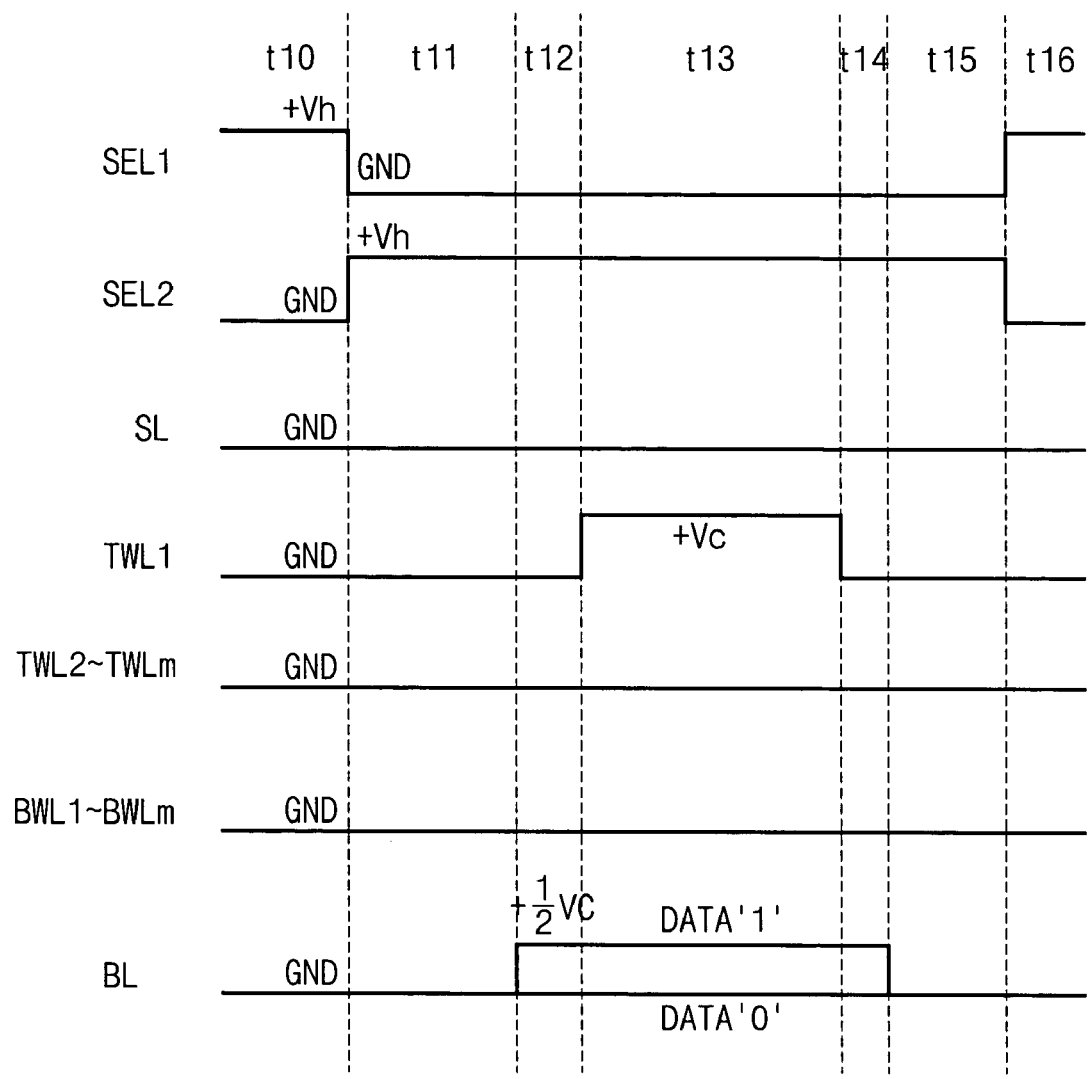
FIG. 10 is a timing diagram illustrating a write operation of a second operation period of FIG. 8.

FIG. 10 is a timing diagram illustrating the second step of the write operation, during which bits of "0" are written into the memory device. It is assumed in FIG. 9 that the memory device includes such a memory array as shown in FIG. 5 and that the first memory cell $Q_1$ of the cell array of FIG. 5 is selected.

FIG. 10 shows that the second step includes seven time periods, t10~t16. In the first period t10 and the seventh period t16, a high level voltage +Vh is applied to the selecting line SEL1, and other lines are at the ground state GND.

In the second period t11, the selecting line SEL1 connected to the switching element $Q_0$ is grounded, and a high level voltage +Vh is applied to the selecting line SEL2 connected to the switching element $Q_{m+1}$.

In the third period t12, the previously written bits of "1" are maintained, by a voltage having a potential of (+½ Vc) applied to the bit line BL.

In the fourth period t13, the positive polarization transition threshold voltage +Vc is applied to the top word line TWL1 of the selected memory cell $Q_1$. Because of the voltage of +½Vc is applied to the bit line BL corresponding to the memory cell $Q_1$, the bit of "1" stored in the memory cell $Q_1$ is maintained. In the mean time, bits of "0" may be written into other selected memory cells (not shown) associated with bit lines biased at a ground level.

In the fifth period t14, the top word line TWL1 connected to the selected memory cell $Q_1$ is grounded.

In the sixth period t15, the bit line BL is grounded.

Figure 11:
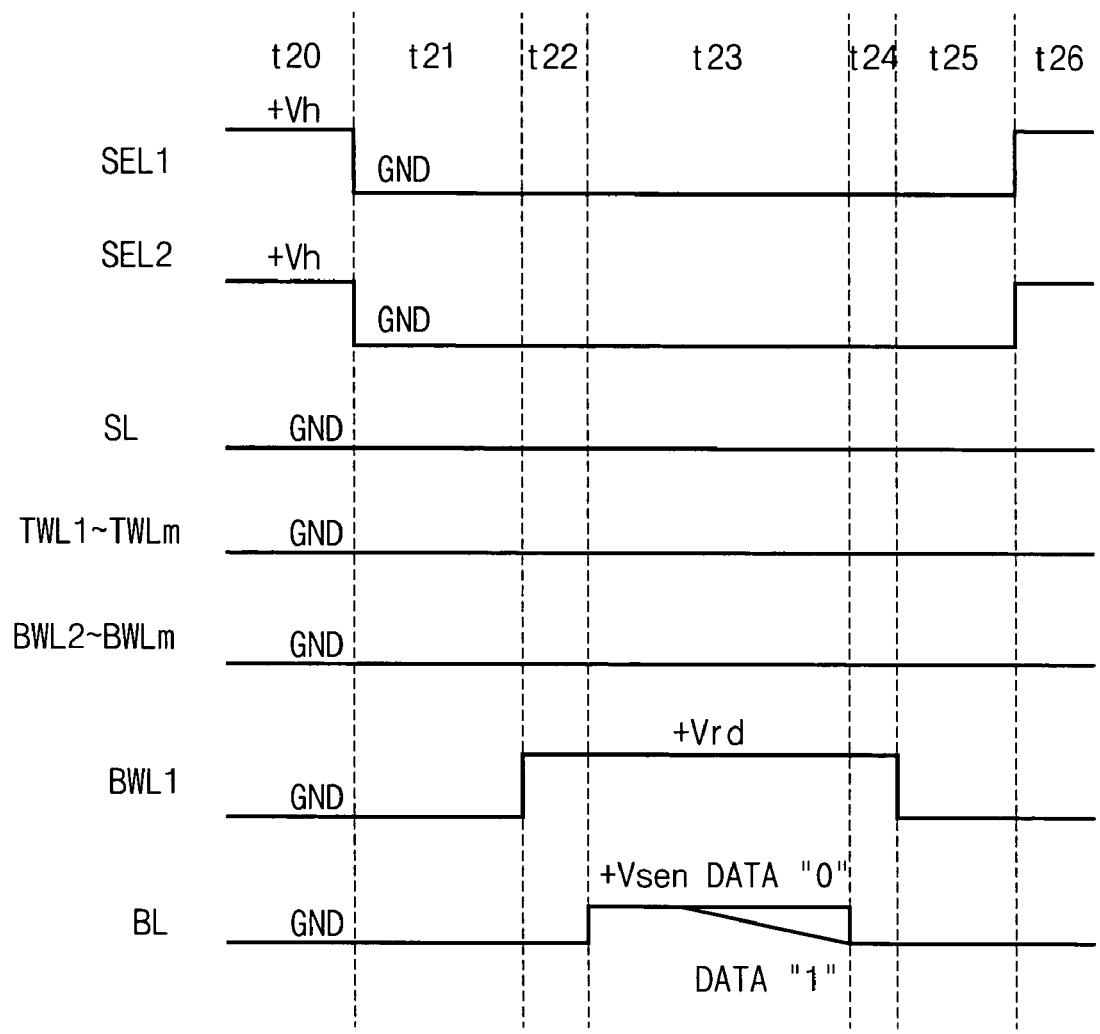
FIG. 11 is a timing diagram illustrating a read operation of the unit cell array of FIG. 5.

FIG. 11 is a timing diagram illustrating a read operation of a ferroelectric memory device including the unit cell array of FIG. 5. It is assumed in FIG. 11 that the first memory cell $Q_1$ of the unit cell array of FIG. 5 is selected.

The read operation is divided into seven time periods, t20~t26. The first period t20 and the seventh period t26 are precharge periods, during a high level voltage +Vh is applied to selecting lines SEL1 and SEL2, and other lines are grounded.

In the second period t21, the selecting lines SEL1 and SEL2 are grounded.

In the third period t22, a positive read voltage Vrd is applied to the bottom word line BWL1 of the selected memory cell $Q_1$.

In the fourth period t23, a positive sensing voltage +Vsen is applied to the bit line BL, and current flowing through the bit line BL is sensed. If the current through the bit line BL is small and the potential on the bit line BL is maintained at the level of the sensing voltage +Vsen, it may be determined that a bit of "0" is stored in the selected memory cell $Q_1$. Conversely, if the current through the bit line BL is significant and the potential on the bit line BL decreases to lower than the sensing voltage +Vsen, it may be determined that a bit of "1" is stored in the selected memory cell $Q_1$.

In the fifth period t24, the bit line BL is grounded.

In the sixth period t25, the bottom word line BWL1 of the selected memory cell $Q_1$ is grounded.

Figure 12:
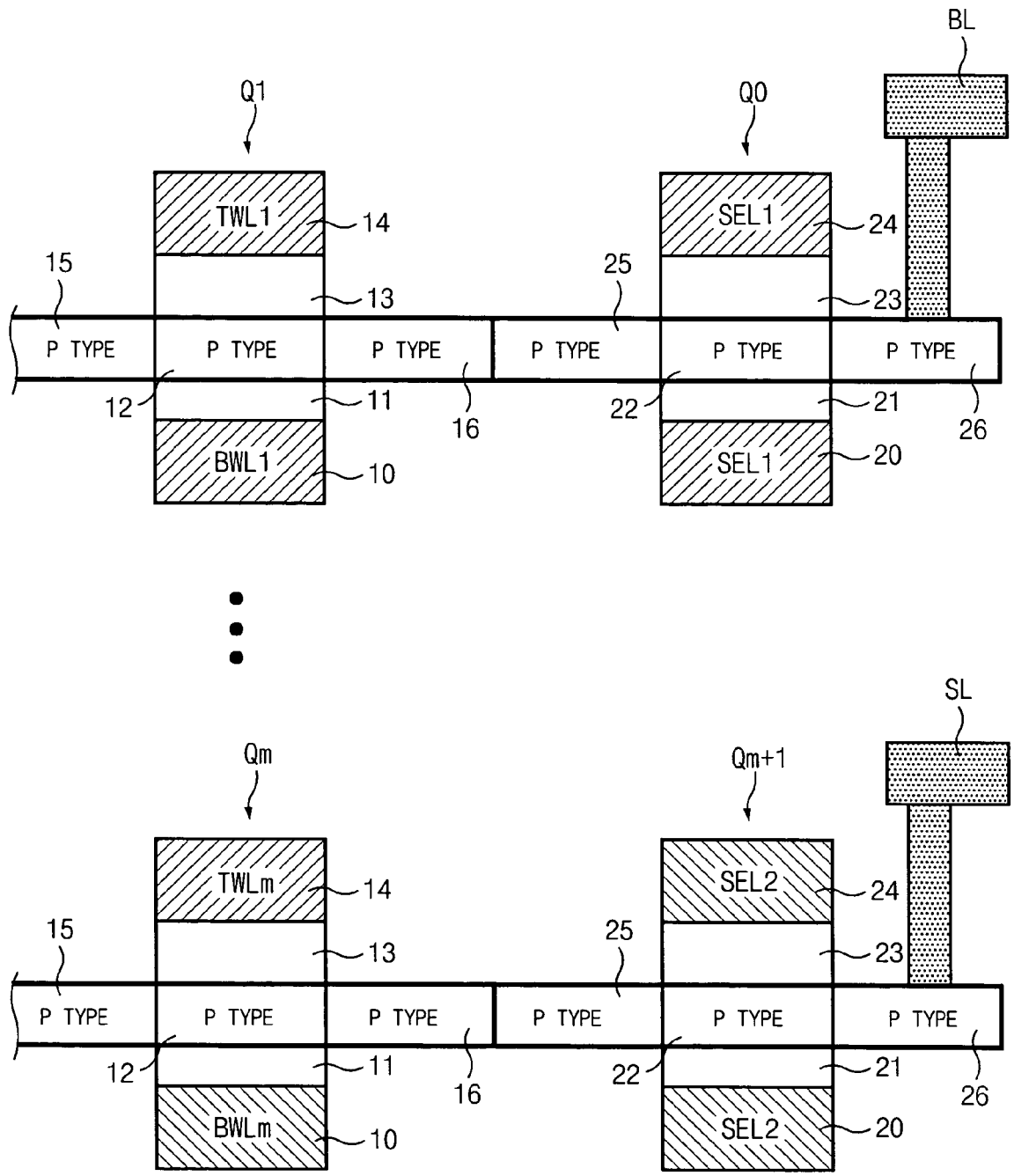
FIG. 12 is a cross-sectional diagram illustrating connection relationships of a memory cell $Q_1$ and a switching device $Q_0$ and of a memory cell $Q_m$ and a switching device $Q_{m+1}$.

FIG. 12 is a cross-sectional view illustrating the connection between the memory cell $Q_1$ and the switching device $Q_0$ and between the memory cell $Q_m$ and the switching device $Q_{m+1}$ of FIG. 5.

As FIG. 12 shows, the p-type source region 26 of the switching element $Q_0$ is connected to the bit line BL, and the p-type drain region 25 is connected to the p-type source region 16 of the memory cell $Q_1$.

The p-type source region 26 of the switching element $Q_{m+1}$ is connected to the sensing line SL, and the p-type drain region 25 is connected to the p-type source region 16 of the memory cell $Q_m$.

Figure 13:
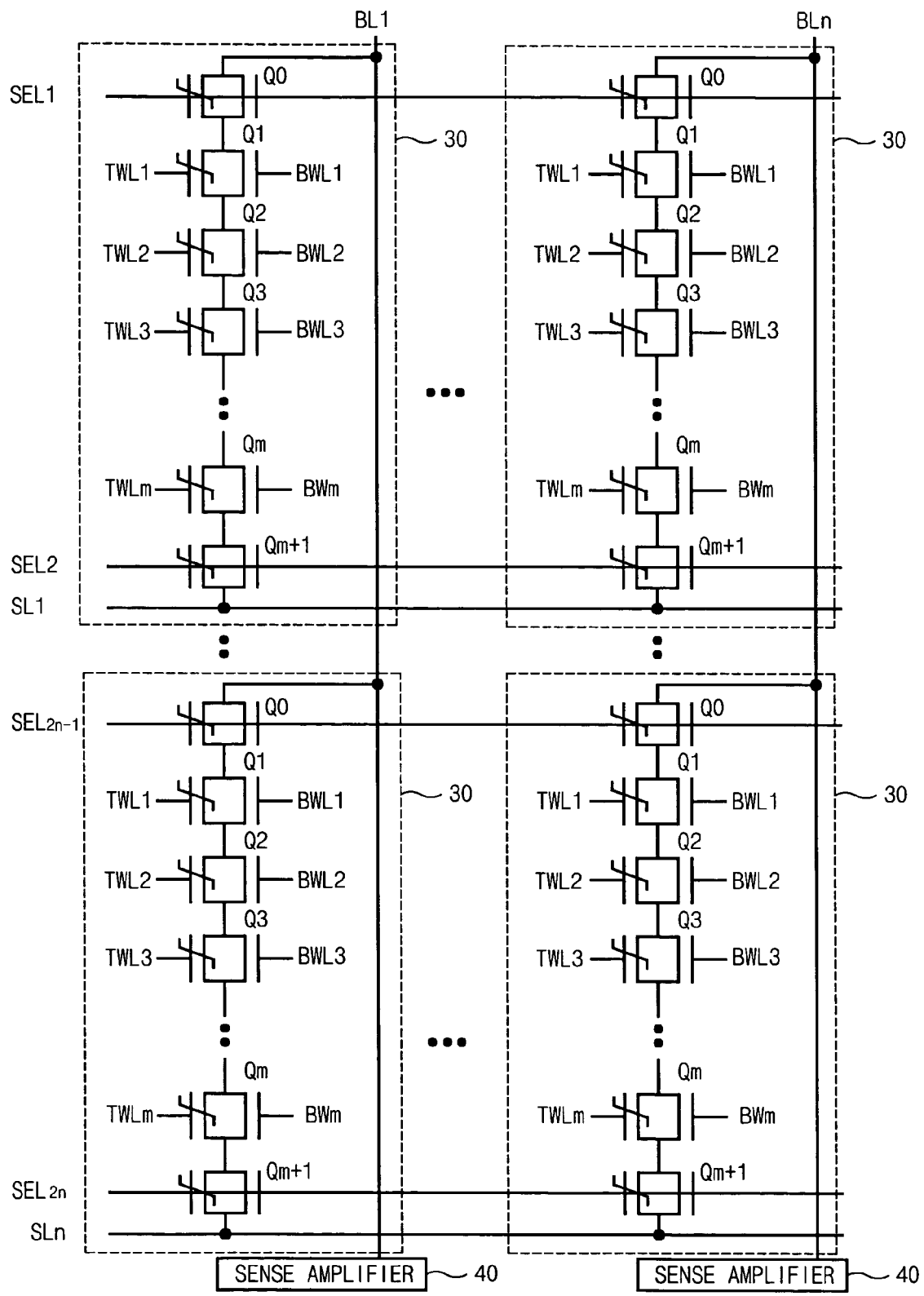
FIG. 13 is a circuit diagram illustrating a memory array including a plurality of unit cell arrays of FIG. 5.

FIG. 13 is a circuit diagram illustrating a memory array including a plurality of cell arrays.

Referring to FIG. 13, in each column, a plurality of cell arrays 30 are connected in common to a corresponding one of bit lines BL1~BLn and a corresponding one of sense amplifiers 40.

In each row, the plurality of cell arrays 30 are connected in common to selecting lines $SEL_1$, $SEL_2$-$SEL_{2n-1}$, $SEL_{2n}$, and the corresponding one of sensing lines SL1~SLn.

As described above, a nonvolatile ferroelectric memory device consistent with the present invention includes a floating channel layer formed between a top word line and a bottom word line to improve the reliability of cells. Also, the nonvolatile ferroelectric memory device includes a nano-scaled floating channel layer formed between a top word line and a bottom word line to reduce the whole size of cells. Moreover, a switching element for controlling a switching operation of the memory cell is configured to have the same structure as that of a cell transistor, thereby simplifying the process for manufacturing a memory device consistent with the present invention. In addition, voltages applied to the memory cell consistent with the present invention can be more easily regulated.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A nonvolatile ferroelectric memory device comprising:
   a plurality of memory cells connected serially between a bit line and a sensing line;
   a first switching unit configured to selectively connect the plurality of memory cells to the bit line in response to a first selecting signal; and
   a second switching unit configured to selectively connect the plurality of memory cells to the sensing line in response to a second selecting signal,
   wherein each of the plurality of memory cells, the first switching unit, and the second switching unit comprises:
   a bottom word line;
   an insulating layer formed on the bottom word line;
   a floating channel layer formed on the insulating layer;
   a ferroelectric layer formed on the floating channel layer; and
   a top word line formed on the ferroelectric layer in parallel with the bottom word line,
   wherein, when a bit of "1" is written in a selected one of the memory cells, the first switching unit and the second switching unit are turned on and a negative polarization transition threshold voltage is applied to the top word line of the selected memory cell.

2. The memory device of claim 1, wherein the floating channel layer comprises one of a carbon nano tube, a silicon, a germanium, and an organic semiconductor.

3. The memory device of claim 1, wherein a channel resistance of the floating channel layer changes with a polarity of the ferroelectric layer.

4. The memory device of claim 1, wherein the floating channel layer comprises:
   a p-type channel region formed on the insulating layer having two sides; and
   a p-type drain region and a p-type source region connected to the two sides of the p-type channel region.

5. The memory device of claim 4, wherein the p-type channel region has a first resistance when positive charges are induced therein by a first polarization of the ferroelectric layer, and has a second resistance when negative charges are induced therein by a second polarization of the ferroelectric layer, the first resistance being lower than the second resistance.

6. The memory device of claim 1, wherein, when a bit of "0" is written in a selected one of the memory cells, the first switching unit is turned on, the second switching unit is turned off, and a positive polarization transition threshold voltage is applied to the top word line of the selected memory cell.

7. The memory device of claim 6, further comprising additional selected memory cells corresponding to additional bit lines, wherein, when a bit of "0" is written in the selected memory cell, a voltage having a potential equal to a half of that of the positive polarization transition threshold voltage is applied to the additional bit lines corresponding to the additional selected memory cells.

8. The memory device of claim 1, wherein, when reading a selected one of the memory cells, the first switching unit and the second switching unit are turned on and a positive sensing voltage is applied to the bit line while a positive read voltage is applied to the bottom word line of the selected memory cell.

9. The memory device of claim 8, wherein a current through the bit line is detected to determine a bit of datum stored in the selected memory cell.

10. A nonvolatile ferroelectric memory device comprising:
    a plurality of bit lines;
    a plurality of sensing lines;
    a plurality of unit cell arrays each connected in common to a corresponding one of the bit lines in a column direction and to a corresponding one of the sensing lines in a row direction; and
    a plurality of sense amplifiers connected to the plurality of bit line,
    wherein each of the plurality of unit cell arrays comprises:
        a plurality of memory cells connected serially between the corresponding bit line and the corresponding sensing line;
        a first switching unit configured to selectively connect the memory cells to the corresponding bit line in response to a first selecting signal; and
        a second switching unit configured to selectively connect the memory cells to the corresponding sensing line in response to a second selecting signal,
    wherein each of the plurality of memory cells, the first switching unit, and the second switching unit comprises:
        a bottom word line;
        an insulating layer formed on the bottom word line;
        a floating channel layer formed on the insulating layer;
        a ferroelectric layer formed on the floating channel layer; and
        a top word line formed on the ferroelectric layer in parallel with the bottom word line, and
    wherein, when a bit of "1" is written in a selected one of the memory cells, the corresponding first switching unit and the corresponding second switching unit are turned on and a negative polarization transition threshold voltage is applied to the top word line of the selected memory cell.

11. The memory device of claim 10, wherein the floating channel layer comprises:
    a p-type channel region formed on the insulating layer having two sides; and
    a p-type drain region and a p-type source region connected to both sides of the p-type channel region.

12. The memory device of claim 10, wherein a channel resistance of the floating channel layer changes with a polarity of the ferroelectric layer.

13. The memory device of claim 12, wherein the p-type channel region has a first resistance when positive charges are induced therein by a first polarization of the ferroelectric layer and has a second resistance when negative charges are induced therein by a second polarization of the ferroelectric layer, the first resistance being lower than the second resistance.

14. The memory device of claim 10, wherein, when a bit of "0" is written in a selected one of the memory cells, the corresponding first switching unit is turned on, the corresponding second switching unit is turned off, and a positive polarization transition threshold voltage is applied to the top word line of the selected memory cell.

15. The memory device of claim 10, further comprising additional selected memory cells associated with additional bit lines, wherein, when a bit of "0" is written in a selected one of the memory cells, a voltage having a potential equal to a half of that of a positive polarization transition threshold voltage is applied to the additional bit lines corresponding to the additional selected memory cells.

16. The memory device of claim 10, wherein, when data stored in the selected memory cell are read, the first switching unit and the second switching unit are turned on, a positive sensing voltage is applied to the bit line, and a positive read voltage is applied to the bottom word line of the selected memory cell.

17. The memory device of claim 10, wherein a current through the bit line is detected to read a datum stored in the selected memory cell.

* * * * *